United States Patent
Venkataraman et al.

(10) Patent No.: US 12,153,490 B2
(45) Date of Patent: Nov. 26, 2024

(54) READ CALIBRATION BY SECTOR OF MEMORY

(71) Applicant: Micron Technology, Inc., Boise, ID (US)

(72) Inventors: Priya Venkataraman, Boise, ID (US); Pitamber Shukla, Boise, ID (US); Vipul Patel, Santa Clara, CA (US); Scott A. Stoller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 17/566,921

(22) Filed: Dec. 31, 2021

(65) Prior Publication Data
US 2023/0214299 A1 Jul. 6, 2023

(51) Int. Cl.
*G11C 16/34* (2006.01)
*G06F 3/06* (2006.01)
*G06F 11/07* (2006.01)
*G06F 11/10* (2006.01)
*G06F 12/0882* (2016.01)
*G11C 29/04* (2006.01)
*G11C 29/44* (2006.01)

(52) U.S. Cl.
CPC .......... *G06F 11/108* (2013.01); *G06F 3/0619* (2013.01); *G06F 3/0656* (2013.01); *G06F 3/0688* (2013.01); *G06F 11/0772* (2013.01); *G06F 11/0793* (2013.01); *G06F 11/1012* (2013.01); *G06F 12/0882* (2013.01); *G11C 16/3404* (2013.01); *G11C 16/3418* (2013.01); *G11C 29/04* (2013.01); *G11C 29/44* (2013.01)

(58) Field of Classification Search
None
See application file for complete search history.

(56) References Cited

U.S. PATENT DOCUMENTS

2020/0159447 A1   5/2020   Luo et al.
2022/0122674 A1 * 4/2022   Bazarsky ............... G11C 16/26

\* cited by examiner

*Primary Examiner* — Alfredo Bermudez Lozada
(74) *Attorney, Agent, or Firm* — Brooks, Cameron & Huebsch, PLLC

(57) ABSTRACT

Read calibration by sector of memory can include reading a page of memory, having more than one sector, with a read level, such as a default read level. In response to an error, such as an uncorrectable error correction code read result, the respective read level can be calibrated for each sector to yield a respective calibrated read level per sector. The page of memory can be read with the respective calibrated read level per sector. The calibrated read levels can be stored.

19 Claims, 9 Drawing Sheets

---

READING A PAGE OF MEMORY WITH A READ LEVEL, WHEREIN THE PAGE OF MEMORY INCLUDES A PLURALITY OF SECTORS — 970

RECEIVING AN UNCORRECTABLE ERROR CORRECTION CODE (UECC) READ RESULT — 972

CALIBRATING THE READ LEVEL FOR EACH OF THE PLURALITY OF SECTORS OF MEMORY IN RESPONSE TO THE UECC READ RESULT TO YIELD A RESPECTIVE CALIBRATED READ LEVEL PER SECTOR — 974

READING THE PAGE OF MEMORY WITH THE RESPECTIVE CALIBRATED READ LEVEL PER SECTOR — 976

READ CALIBRATION BY SECTOR OF MEMORY

TECHNICAL FIELD

The present disclosure relates generally to memory, and more particularly to apparatuses and methods associated with read calibration by sector of memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

The present disclosure includes apparatuses and methods related to read calibration by sector of memory. Auto read calibration may be performed for memory such that read signals are adjusted on a per memory device basis or a per page of a memory device basis. However, this may cause data recovery operations (e.g., redundant array of independent NAND (RAIN) data recovery operations) to be performed if the auto read calibration does not sufficiently reduce the raw bit error rate sufficiently for error correction code (ECC) circuitry to correct outstanding errors. In some memory systems, a read calibration operation takes one order of magnitude more time than a read operation and a RAIN operation takes two orders of magnitude more time than a read operation. By way of example, a read operation can take 50 microseconds (μs), a read calibration operation can take 250 μs, and a RAIN operation can take 6.4 miliseconds.

Aspects of the present disclosure address the above and other deficiencies. For instance, read calibration can be performed on a per sector basis. Read calibration can be performed after an uncorrectable ECC (UECC) error is detected and before a RAIN operation is initiated. Therefore, if a read calibration operation can provide for sufficient improvement in the read operation to either remove the errors or allow the ECC circuitry to correct the errors, that is preferable to initiating a RAIN operation to recover the data. Embodiments of the present disclosure can improve reliability (e.g., raw bit error rates) and error recovery performance.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

Figure 2:
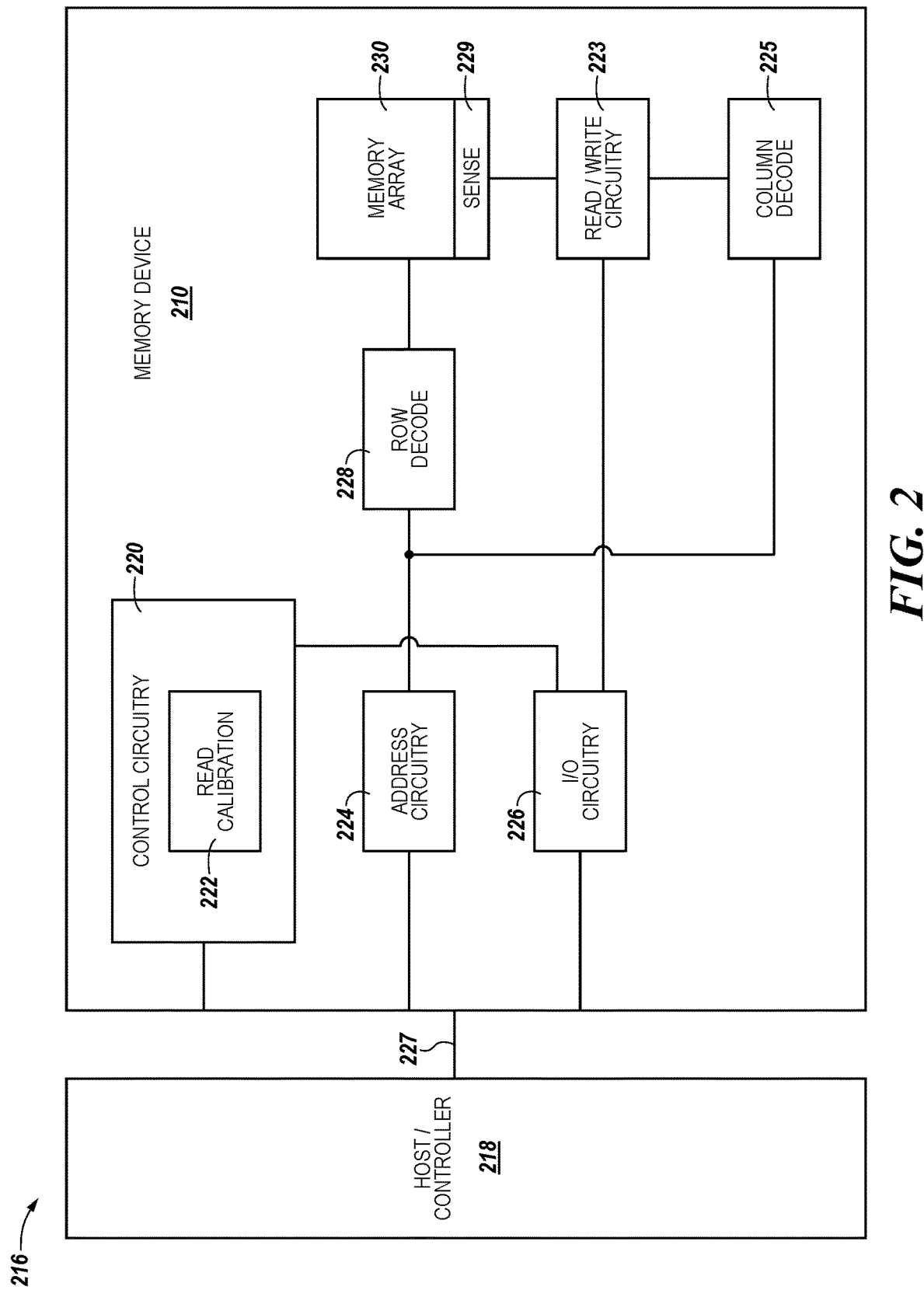
FIG. 2 is a block diagram of an apparatus in the form of a computing system including a memory device in accordance with a number of embodiments of the present disclosure.

The figures herein follow a numbering convention in which the first digit or digits correspond to the drawing figure number and the remaining digits identify an element or component in the drawing. For example, element 230 in FIG. 2 is analogous to element 330 in FIG. 3. Analogous elements within a Figure may be referenced with a hyphen and extra numeral or letter. See, for example, elements 332-1, 332-2, 332-3, . . . , 332-M in FIG. 3. Such analogous elements may be generally referenced without the hyphen and extra numeral or letter. For example, elements 332-1, 332-2, 332-3, . . . , 332-M in FIG. 3 may be collectively referenced as 332. As used herein, the designators "C", "M", and "N", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure.

In addition, as will be appreciated, the proportion and the relative scale of the elements provided in the figures are intended to illustrate certain embodiments of the present invention and should not be taken in a limiting sense.

Figure 1:
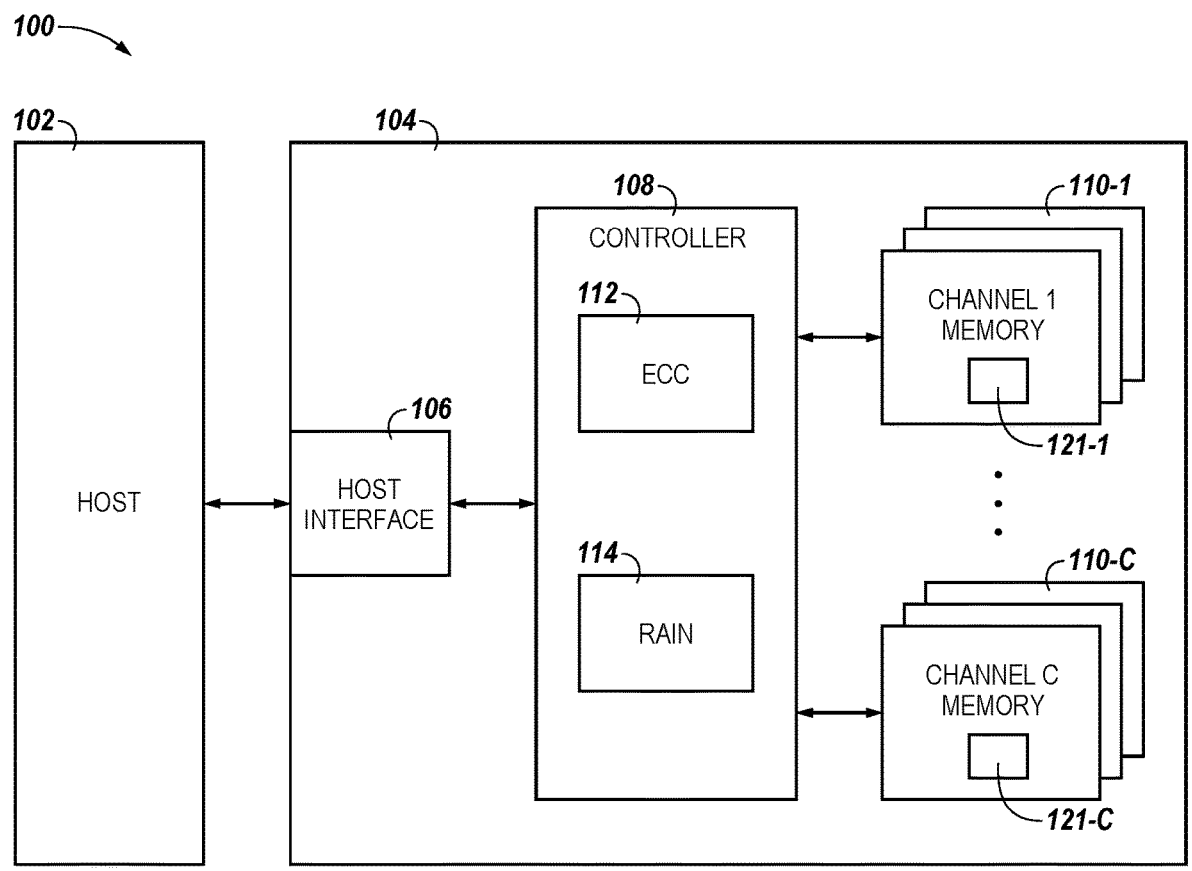
FIG. 1 is a block diagram of an apparatus in the form of a computing system including a memory system in accordance with a number of embodiments of the present disclosure.

FIG. 1 is a block diagram of an apparatus in the form of a computing system 100 including a memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, . . . , 110-C (e.g., solid state memory devices such as NAND flash devices), which provide a storage volume for the memory system 104. The memory system 104 can be a single memory device.

As illustrated in FIG. 1, the controller 108 can be coupled to the host interface 106 and to the memory devices 110 via a plurality of channels and can be used to send data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

The host 102 can be a host system such as a satellite, a communications tower, a personal laptop computer, a desktop computer, a digital camera, a mobile telephone, a memory card reader, an Internet-of-Things (IoT) enabled device, an automobile, among various other types of hosts. For clarity, the system 100 has been simplified to focus on features with particular relevance to the present disclosure. The host 102 can include a number of processing resources (e.g., one or more processors, microprocessors, or some other type of controlling circuitry) capable of accessing the memory device 104. The host 102 can also be a memory controller, such as where memory system 104 is a memory device (e.g., having an on-die controller).

The controller 108 can communicate with the memory devices 110 to control data read, write, and erase operations, among other operations. The memory devices 110 can be a plurality of memory arrays on a single die, a plurality of memory arrays on multiple dies, or a single memory array on a single die. The controller 108 can be on the same die or a different die than any or all of the memory devices 110. Read requests can originate from the host 102 and/or from the memory system 104, among other originations (e.g., from a direct memory access (DMA) device).

The arrays can be flash arrays with a NAND architecture or a NOR architecture, for example. However, embodiments are not limited to a particular type of memory array or array architecture. NAND type flash memory includes, for example, two-dimensional NAND (2D NAND) and three-dimensional NAND (3D NAND). Although floating-gate type flash memory cells in a NAND architecture are generally referred to herein, embodiments are not so limited. Other examples include electrically erasable programmable ROM (EEPROM), erasable programmable ROM (EPROM), ferroelectric RAM (FRAM), and resistance variable memory such as phase change memory (PCM), resistive random access memory (RRAM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), and three dimensional cross-point (3DXPoint) among others. 3DXPoint memory can perform bit storage based on a change of bulk resistance, in conjunction with a stackable cross-gridded data access array. Additionally, in contrast to many flash-based memories, 3DXPoint can perform a write in-place operation, where a non-volatile memory cell can be programmed without the non-volatile memory cell being previously erased.

Although not specifically illustrated, in some embodiments, the controller 108 can include a discrete memory channel controller for each channel coupling the controller 108 to the memory devices 110. The controller 108 can include, for example, a number of components in the form of hardware and/or firmware (e.g., a number of integrated circuits) and/or software for controlling access to the memory devices 110 and/or for facilitating data transfer between the host 102 and memory devices 110.

The memory devices 110 can include a number of arrays of memory cells (e.g., non-volatile memory cells). The memory cells can be grouped, for instance, into a number of blocks including a plurality of physical pages. In some embodiments, the memory cells associated with a physical page can also be associated with a single access line. Each physical page can include more than one physical sector as described in more detail herein. A number of blocks can be included in a plane of memory cells and an array can include a number of planes.

As illustrated in FIG. 1, the controller 108 can include error correction code (ECC) circuitry 112 that can be configured to perform ECC operations such as error coding and/or error decoding. ECC encoding refers to encoding data by adding redundant bits to the data. ECC decoding refers to examining the ECC encoded data to check for any errors in the data. In general, the ECC can not only detect the error but also can correct a subset of the errors it is able to detect. Data can be error coded as codewords. A codeword can have a total size that includes a wrapper and a payload. The codeword payload can refer to the data (e.g., user data) that is encoded within the codeword. The codeword wrapper can refer to the error data that is encoded in the codeword along with the payload to protect the payload.

The controller 108 can include redundant array of independent NAND (RAIN) circuitry 114, which may also be referred to in the art as redundant array of independent disks (RAID) circuitry. With respect to solid state memory, RAIN refers to distributed data storage across multiple banks of a physical memory device 110 or across multiple physical memory devices 110, where the distribution serves to achieve one or more of reliability, availability, performance, and capacity. The RAIN circuitry 114 can provide one or more of data mirroring, data parity, striping, and combinations thereof depending on the particular implementation. In some embodiments, the RAIN circuitry 114 can operate on data in conjunction with the ECC circuitry 112 to provide check-and-recover correction. In some embodiments, the ECC circuitry 112 can correct up to a threshold number of errors and if additional errors are present, the RAIN circuitry 114 can provide data recovery. An uncorrectable ECC read result may be referred to as a UECC read result. In at least one embodiment, the check-and-recover correction provided by the ECC circuitry 112 and the RAIN circuitry 114 is supplemental to the error correction provided by the ECC circuitry 112. For example, if data read from the memory devices 110 has an error correctable by the ECC circuitry 112, it can do so without further data recovery by the RAIN circuitry 114. However, if an error persists that is not correctable by the ECC circuitry 112, then the data may be recoverable by the RAIN circuitry 114.

Although illustrated as components within the controller 108 in FIG. 1, each of the ECC circuitry 112 and RAIN circuitry 114 can be external to the controller 108 or have a number of components located within the controller 108 and a number of components located external to the controller 108. The functionality described herein as being implemented by the controller 108 (e.g., by the ECC circuitry 112 and/or the RAIN circuitry 114) can be provided as a non-transitory electronic device readable medium storing instructions executable by the electronic device (e.g., firmware in the controller 108) to provide the functionality.

Another operation that can be performed in response to a UECC read result is a read calibration. In some embodiments, the read calibration can be initiated by the controller 108. In some embodiments, the read calibration can be initiated by control circuitry of a memory device 110 (e.g., control circuitry 220 illustrated in FIG. 2). The memory devices 110 can include respective read calibration circuitry 121-1, 121-C configured to perform the read calibration.

FIG. 2 is a block diagram of an apparatus in the form of a computing system 216 including a memory device 210 in accordance with a number of embodiments of the present disclosure. The memory device 210 is coupled to a host and/or controller 218 via an interface 227. The interface 227 can pass control, address, data, and other signals between the memory device 210 and the host 218. The interface 227 can include a command bus (e.g., coupled to the control circuitry 220), an address bus (e.g., coupled to the address circuitry 224), and a data bus (e.g., coupled to the input/output (I/O) circuitry 226). In some embodiments, the command bus and the address bus can be comprised of a common command/address bus. In some embodiments, the command bus, the address bus, and the data bus can be part of a common bus. The command bus can pass signals between the host 218 and the control circuitry 220 such as clock signals for timing, reset signals, chip selects, parity information, alerts, etc. The address bus can pass signals between the host 218 and the address circuitry 224 such as logical addresses of memory banks in the memory array 230 for memory operations. The interface 227 can be a physical interface employing a suitable protocol. Such a protocol may be custom or proprietary, or the interface 227 may employ a standardized protocol, such as Peripheral Component Interconnect Express (PCIe), Gen-Z interconnect, cache coherent interconnect for accelerators (CCIX), etc. In some cases, the control circuitry 220 is a register clock driver (RCD), such as RCD employed on an RDIMM or LRDIMM.

The control circuitry 220 can decode signals provided by the host 218. The control circuitry 220 can also be referred to as a command input and control circuit and can represent the functionality of different discrete ASICs or portions of different ASICs depending on the implementation. The signals can be commands provided by the host 218. These signals can include chip enable signals, write enable signals, and address latch signals, among others, that are used to control operations performed on the memory array 230. Such operations can include data read operations, data write operations, data erase operations, data move operations, etc. The control circuitry 220 can comprise a state machine, a sequencer, and/or some other type of control circuitry, which may be implemented in the form of hardware, firmware, or software, or any combination of the three.

Data can be provided to and/or from the memory array 230 via data lines coupling the memory array 230 to input/output (I/O) circuitry 226 via read/write circuitry 223. The I/O circuitry 226 can be used for bi-directional data communication with the host 218 over an interface. The read/write circuitry 223 is used to write data to the memory array 230 or read data from the memory array 230. As an example, the read/write circuitry 223 can comprise various drivers, latch circuitry, etc. In some embodiments, the data path can bypass the control circuitry 220.

The memory device 210 includes address circuitry 224 to latch address signals provided over the interface 227. Address signals are received and decoded by a row decoder 228 and a column decoder 225 to access the memory array 230. Data can be read from memory array 230 by sensing voltage and/or current changes on the sense lines using sensing circuitry 229. The sensing circuitry 229 can be coupled to the memory array 230. The sensing circuitry 229 can comprise, for example, sense amplifiers that can read and latch a page (e.g., row) of data from the memory array 230. Sensing (e.g., reading) a bit stored in a memory cell can involve sensing a relatively small voltage difference on a pair of sense lines, which may be referred to as bitlines, digit lines, or data lines.

The memory array 230 can comprise memory cells arranged in rows coupled by access lines (which may also be referred to as word lines or select lines) and columns coupled by sense lines (which may also be referred to as bitlines, digit lines, or data lines). Although the memory array 230 is shown as a single memory array, the memory array 230 can represent a plurality of memory arrays arraigned in banks of the memory device 210. The memory array 230 can include a number of memory cells, such as volatile memory cells (e.g., DRAM memory cells, among other types of volatile memory cells) and/or non-volatile memory cells (e.g., RRAM memory cells, among other types of non-volatile memory cells).

The control circuitry 220 can also include read calibration circuitry 222. In some embodiments, the read calibration circuitry 222 comprises an application specific integrated circuit (ASIC) configured to perform the read calibration operations described herein. In some embodiments, the read calibration circuitry 222 represents functionality of the control circuitry 220 that is not embodied in separate discrete circuitry. The read calibration circuitry 222 is configured to cause different read levels to be used for different sectors of a selected access line of the memory array 230. The read calibration circuitry is configured to cause a quantity of errors associated with each of the different read levels to be counted per sector. The read calibration circuitry 222 is configured to cause a respective one of the different read levels that yields a fewest quantity of errors per sector to be set as a calibrated read level to be used to read the sector for subsequent read operations. Additional functionality of the read calibration circuitry 222 is described with respect to the read calibration operations herein.

Figure 3:
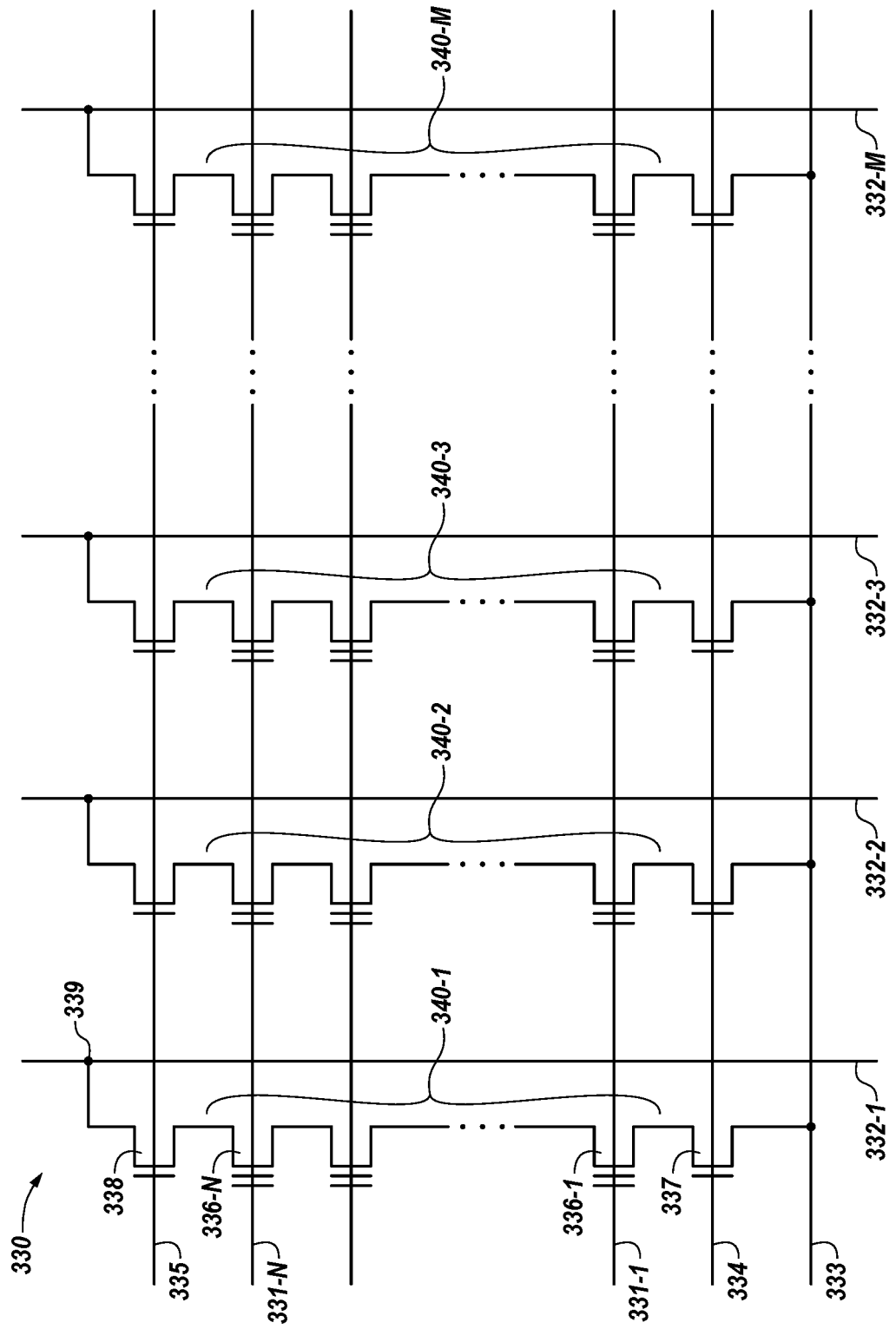
FIG. 3 is a schematic of a portion of a non-volatile memory array in accordance with a number of embodiments of the present disclosure.

FIG. 3 is a schematic of a portion of a non-volatile memory array 330 in accordance with a number of embodiments of the present disclosure. The memory array 330 can be contained within the memory devices 110 illustrated in FIG. 1. The embodiment of FIG. 3 illustrates a NAND architecture non-volatile memory array. However, embodiments described herein are not limited to this example. As shown in FIG. 3, the memory array 330 includes access lines 331-1, . . . , 331-N (e.g., word lines) and intersecting sense lines 332-1, 332-2, 332-3, . . . , 332-M (also known as data lines or bitlines). For ease of addressing in the digital environment, the number of access lines 331 and the number of sense lines 332 can be some power of two (e.g., 356 access lines by 4,096 sense lines).

The memory array 330 includes NAND strings 340-1, 340-2, 340-3, . . . , 340-M. Each NAND string includes non-volatile memory cells 336-1, . . . , 336-N, each communicatively coupled to a respective access line 331. Each NAND string 340 (and its constituent memory cells 336) is also associated with a sense line 332. The memory cells 336 of each NAND string 340 are coupled in series source to drain between a source select gate 337 (e.g., a field-effect transistor (FET)) and a drain select gate 338 (e.g., FET). Each source select gate 337 is configured to selectively couple a respective NAND string 340 to a common source 333 responsive to a signal on source select line 334, while each drain select gate 339 is configured to selectively couple a respective NAND string 340 to a respective sense line 332 responsive to a signal on drain select line 335.

As shown in the embodiment illustrated in FIG. 3, a source of source select gate 337 is coupled to a common source line 333. The drain of source select gate 337 is coupled to the source of the memory cell 336-1 of the corresponding NAND string 340-1. The drain of drain select gate 338 is coupled to sense line 332-1 of the corresponding NAND string 340-1 at drain contact 339. The source of drain select gate 338 is coupled to the drain of the last memory cell 336-N (e.g., a floating-gate transistor) of the corresponding NAND string 340-1.

In a number of embodiments, construction of the non-volatile memory cells 336 includes a source, a drain, a floating gate or other charge storage structure, and a control gate. The memory cells 336 have their control gates coupled to an access line 331. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

A number (e.g., a subset or all) of the memory cells 336 coupled to a selected access line 331 can be written and/or read together as a group. A number of memory cells 336 written and/or read together can correspond to a page of data. As used herein, examples of high-level operations are referred to as writing or reading operations (e.g., from the perspective of a controller), whereas, with respect to the memory cells, such operations are referred to as programming or sensing. A group of memory cells 336 coupled to a particular access line and programmed together to respective states can be referred to as a physical page. Each physical page can be divided into a number of sectors (e.g., four sectors per page). A programming operation can include applying a number of program pulses (e.g., 16V-20V) to a selected access line 331 in order to increase the threshold voltage (Vt) of selected memory cells 336 coupled to that selected access line 331 to a desired program voltage level corresponding to a targeted data state.

Read operations can include sensing a voltage and/or current change of a sense line 332 coupled to a selected memory cell 336 in order to determine the state of the selected memory cell 336. The read operation can include precharging a sense line 332 and sensing the discharge when a selected memory cell 336 begins to conduct. Read operations can use discrete read signal (also known as sensing signal) magnitudes to sense different data states for selected memory cells 336. As used herein, "read level" is different than "read signal" or "sensing signal". "Read level" refers to the magnitude of a signal that results from a read operation performed on a memory cell. This is described in more detail with respect to FIG. 6B and FIG. 7. The terms "read signal" and "sensing signal" are used interchangeably to refer to the signal that is applied to the selected access line when sensing a memory cell.

Sensing the state of a selected memory cell 336 can include providing discrete read signals of varying magnitudes to a selected access line 331, and thus to the control gate of a selected memory cell 336, while providing a signal (e.g., a pass voltage) to access lines coupled to the unselected memory cells 336 of the string 340 sufficient to place the unselected memory cells 336 in a conducting state independent of the charge stored on the unselected memory cells 336. The sense line 332 corresponding to the selected memory cell 336 being read can be sensed to determine whether or not the selected memory cell 336 conducts in response to the particular read signal applied to the selected access line 331. For example, the state of a selected memory cell 336 can be determined by the access line 331 voltage at which the sense line 332 current reaches a particular reference current associated with a particular data state. Although not specifically illustrated in FIG. 3, each sense line 332 can be coupled to a sense amplifier (or a number of the sense lines 332 can be coupled to a sense amplifier). The sense amplifier can be included in a page buffer (e.g., as illustrated in more detail in FIG. 4).

According to at least one embodiment of the present disclosure, a read calibration operation can be performed such that different read levels are used for reading different sectors of a page of memory cells 336. For example with respect to FIG. 3, a different read levels may be used to read memory cells 336 of the string 340-1 versus memory cells 336 associated with the string 340-M.

Figure 4:
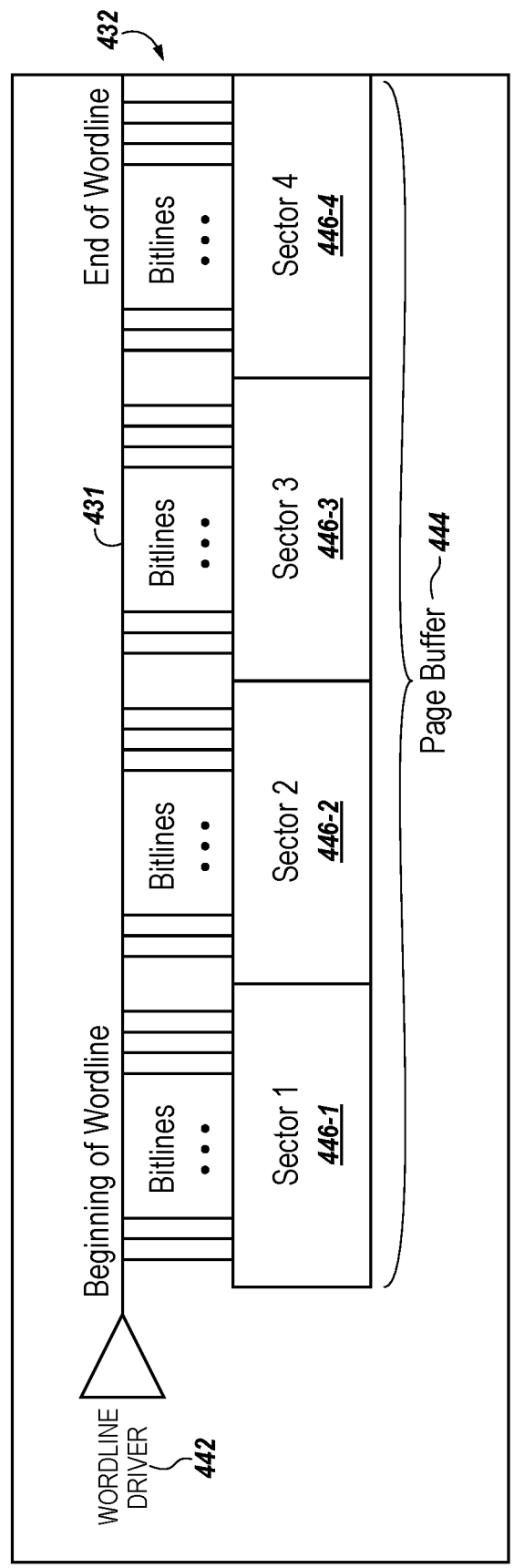
FIG. 4 is a block diagram of a page buffer in accordance with a number of embodiments of the present disclosure.

FIG. 4 is a block diagram of a page buffer 444 in accordance with a number of embodiments of the present disclosure. The page buffer 444 can be part of sensing circuitry (e.g., sensing circuitry 229 illustrated in FIG. 2) that, although not specifically illustrated, can include sense amplifiers. The page buffer 444 is coupled to the sense lines 432. The sense lines 432 illustrated in FIG. 4 can be coupled to multiple access lines, such as the access line 431. The access line 431 can be supplied with power, signals, etc. by an access line driver 443 (also known as a word line driver). The memory cells (not specifically illustrated in FIG. 4) associated with the access line 431 can correspond to a physical page, which can be divided into a number of sectors. In the example illustrated in FIG. 4, the access line 431 is divided into four sectors 446-1, 446-2, 446-3, 446-4, however embodiments are not limited to a specific quantity of sectors. By way of example, the physical page can store 16 kilobytes and each sector 446 can store 4 kilobytes of data.

Figure 5:
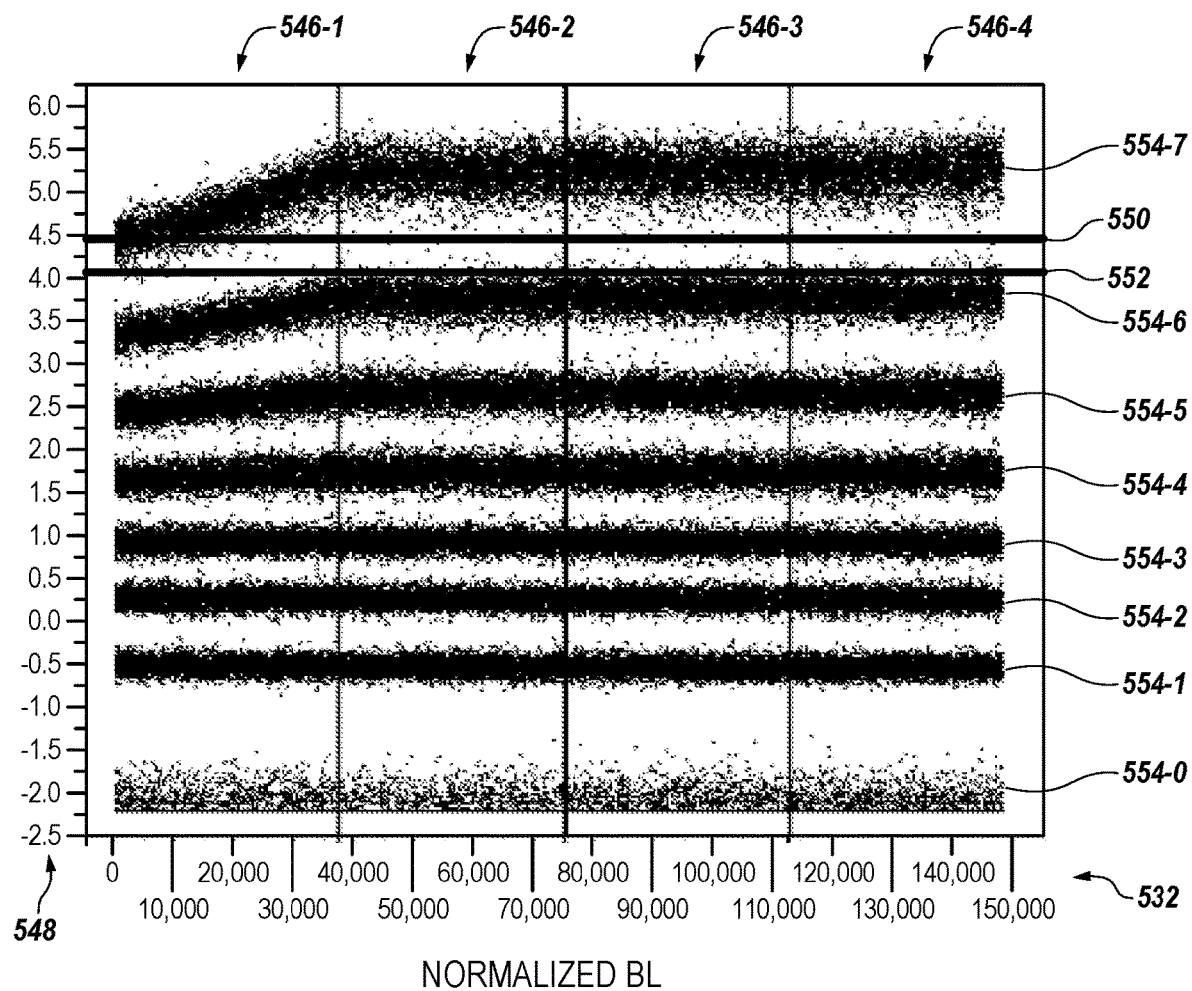
FIG. 5 is a plot of stored charges versus sense lines for a plurality of data states also illustrating an example default read level and calibrated read level in accordance with a number of embodiments of the present disclosure.

Different sectors 446 can be prone to different defects such that performing a read calibration across the entire physical page may result in portions of the page (e.g., sectors) tending to be read correctly and portions of the page tending to be read incorrectly. An example of this is illustrated in FIG. 5. According to at least one embodiment of the present disclosure, each sector 446 is read calibrated such that different read levels may be used for different sectors 446 for the same data state of the memory cells associated therewith. The page buffer 444 can be used to manipulate the read operation such that a change to a read level has an analogous effect as changing a read signal.

FIG. 5 is a plot of stored charges 548 versus sense lines 532 for a plurality of data states also illustrating an example default read signal 550 and calibrated read signal 552 in accordance with a number of embodiments of the present disclosure. The horizontal axis numbering indicates the numbered sense lines 532 representing a physical page of memory. The vertical axis numbering indicates stored charge 548 magnitudes (e.g., voltages and/or charges stored on the memory cells). The four vertical partitions indicate a division of the physical page of memory into sectors 546-1, 546-2, 546-3, 546-4. The data states are indicated by the threshold voltage distributions 554-0, 554-1, 554-2, 554-3, 554-4, 554-5, 554-6, 554-7. The threshold voltage distributions 554 are indicated by the dots, each of which represents the actual charge (e.g., voltage) stored on an individual memory cell. The presence of eight threshold voltage distributions indicate that the corresponding memory cells can be programmed to one of eight data states, meaning that three bits of data are stored per memory cell. The threshold voltage distributions 554 may be referred to simply as distributions 554 herein.

The zeroth distribution 554-0 corresponds to an erased state and is characterized by a relatively wide or scattered distribution of charges corresponding to that data state as indicated by the scattering of dots for the zeroth data state 554-0 being wider than the scattering of dots for the other data states 554-1, 554-2, 554-3, 554-4, 554-5, 554-6, 554-7. With respect to FIG. 5, the width of a distribution refers to the vertical spread of dots representing the charges of specific memory cells programmed (or erased) to a particular data state. The relative width of the distribution 554-0 for the erased state may be of lesser concern than the distributions for other programmed states because there is a wider voltage range (also known as read margin) between the erased state and the next closest data state, which is indicated by the first distribution 554-1. The average value of the zeroth distribution 554-0 for the erased state is fairly consistent across all of the sectors 546 (e.g., from left to right). In other words, the zeroth distribution is presented as a relatively flat, albeit scattered, line across the sense lines 532.

The average value of each of the first through fourth distributions 554-1, 554-2, 554-3, 554-4 is fairly consistent across all of the sense lines 532 and sectors 546. However, the average value of the fifth distribution 554-5 for the first sector 546-1 tapers to a lesser stored charge 548 for sense lines 532 further to the left as indicated in FIG. 5. Note that the tapering of the average value of the fifth distribution 554-5 in the first sector 546-1 also decreases the read margin between the fourth distribution 554-4 and the fifth distribution 554-5. This can contribute to a higher likelihood of read errors. The average value of the fifth distribution 554-5 across the second through fourth sectors 546-2, 546-3, 546-4 is fairly constant.

This trend for the fifth distribution 554-5 repeats, but is magnified for each of the sixth and seventh distributions 554-6, 554-7. In particular, the average value of the seventh distribution 554-7 in the first sector 546-1 changes significantly across the sense lines 532. This trend may indicate that some physical characteristic or defect near one side of the memory device (closer to the sense lines 532 starting with the "0" label) may be disturbing or otherwise affecting the charge states of the memory cells associated therewith, particularly for memory cells storing a relatively greater stored charge 548. This can lead to read errors. The default read signal 550, which can be used to distinguish between memory cells programmed to the sixth data state or seventh data state, may yield errors for memory cells in the first sector 546-1 that are programmed to the seventh data state as indicated by the dots intersecting and/or appearing below the default read signal 550 in the first sector 546-1.

According to at least one embodiment of the present disclosure, the read signal 550 for the first sector 546-1 can be calibrated to yield a calibrated read signal 552 for the first sector 546-1. The read signal for the second, third, and fourth sectors 546-2, 546-3, 546-4 can remain at the default read signal 550 magnitude. In some embodiments, it may not be determinable that the read errors are only occurring in the first sector 546-1 based on the operation of ECC circuitry. Therefore, the read calibration operation can be performed for each sector 546. With respect to the example illustrated in FIG. 5, it is likely that the default read signal 550 would be maintained for the second, third, and fourth sectors 546-2, 546-3, 546-4 because very few dots overlap and/or underlie the default read signal 550 for the seventh distribution 554-7 (data state), meaning there would be few errors and that a different read signal would likely not yield better results for those sectors.

In contrast to some previous approaches that calibrate a read signal for a data state for an entire page of memory, embodiments of the present disclosure can advantageously provide for better read results by calibrating the read signal per sector 546. For example, if the calibrated read signal 552 was used to read the entire page, it is likely that the second, third, and fourth sectors 546-2, 546-3, 546-4 would generate more errors than they would being read with the default read signal 550 because the calibrated read signal 552 overlaps many dots associated with the sixth distribution 554-6. Stated differently, a page-wise read calibration for the default read signal 550 might not provide any read signal sufficient to overcome a UECC read results for the entire page. As described herein, if the page-wise read calibration operation did not overcome the UECC read result, a relatively time and resource intensive RAIN operation could then be initiated to attempt to recover the data.

Additional detail of the read calibration operation is described herein. Although not specifically illustrated in FIG. 5, a read calibration operation can be performed for more than one data state (e.g., a read calibration operation can be performed for a default read signal between the fifth distribution 554-5 and the sixth distribution 554-6). In some embodiments, all read signals can be calibrated (e.g., in response to a UECC read result).

Although two discrete read signals 550, 552 are illustrated, at least one embodiment of the present disclosure includes the application of only one read signal magnitude to a selected access line during a read operation. In at least one embodiment, a different read signal can be used for each sector 546. The effective difference in read signals 500, 552 can be achieved by operation of a page buffer applying a boost signal to a sense line to manipulate the read operation as though a different read signal was applied to the access line. For such embodiments and with respect to the uppermost data state, the default read signal 550 is indicative of both the actual magnitude of the read signal applied to the access line for sensing all four sectors 546-1, 546-2, 546-3, 546-4 as well as the effective magnitude of the read signal applied to the access line for three of the sectors 546-2, 546-3, 546-4. For such embodiments and with respect to the uppermost data state, the calibrated read signal 552 is indicative of the effective magnitude of the read signal applied to the access line for sensing the first sector 546-1. The description with respect to FIG. 5 should be interpreted to apply to default and calibrated read levels as well as calibrated read signals. For example, calibrating the read level can have the same effect as calibrating the read signal as described herein.

Figure 6A:
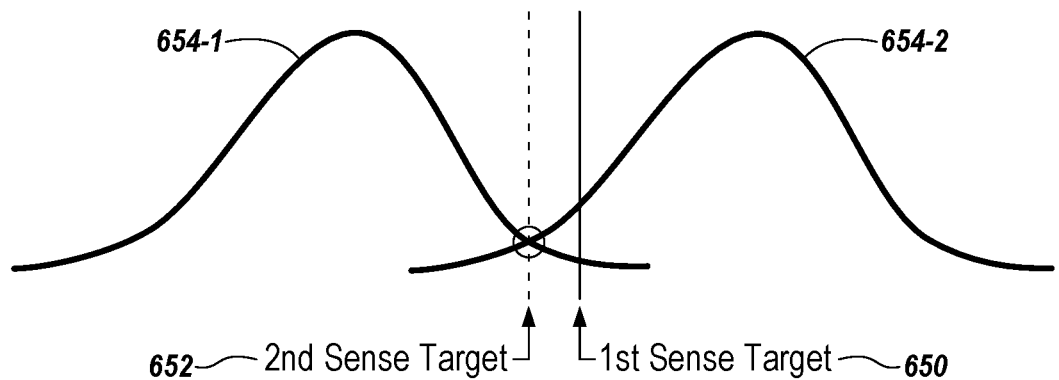
FIG. 6A is a plot of threshold voltage distributions corresponding to adjacent data states also illustrating an example default read level and calibrated read level in accordance with a number of embodiments of the present disclosure.

FIG. 6A is a plot of threshold voltage distributions 654-1, 654-2, corresponding to adjacent data states also illustrating an example default read signal 650 and calibrated read signal 652 in accordance with a number of embodiments of the present disclosure. The horizontal axis represents signal magnitudes (e.g., charge storage states) of memory cells. The vertical axis represents a quantity of memory cells that are programmed to the respective data state associated with each distribution 654. The vertical axis is typically presented on a log scale to illustrate the distributions 654 as bell curves. The adjacent distributions 654 represent statistical distributions of memory cells and their associated states for each of two data states. The first distribution 654-1 corresponds to a first data state and the second distribution 654-2 corresponds to a second data state.

As is illustrated, each distribution 654 has a peak near its center, which can represent a target state for each data state. Each distribution 654 trails off on either side of the peak, which is a representation of variations in the effectiveness of programming operations for individual memory cells. Between adjacent distributions 654 is a valley where data states of individual memory cells corresponding to the different distributions 654 overlap. A memory cell having a charge storage state in the valley may have had a target charge storage state associated with either of the distributions 654-1, 654-2, which can cause read errors. Calibrating a read level can have an analogous effect to calibrating a read signal (e.g., from a default read signal 650 to a calibrated read signal 652) and can help reduce read errors. Read errors can be reduced, for example, by moving the read signal closer to a middle of the valley between adjacent distributions 654.

Figure 6B:
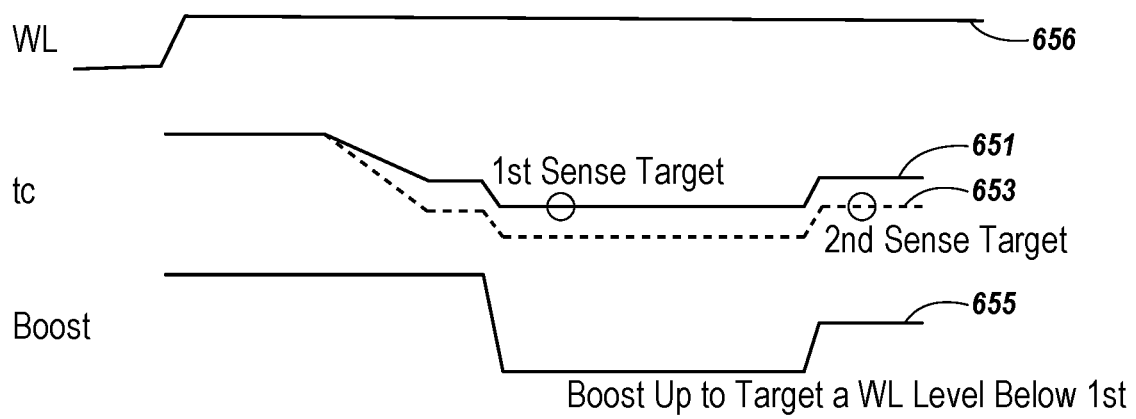
FIG. 6B is a plot of various signals associated with read level calibration by sector in accordance with a number of embodiments of the present disclosure.

FIG. 6B is a plot of various signals associated with read level calibration by sector in accordance with a number of embodiments of the present disclosure. The signals have a horizontal axis generally representing time, which is the same time scale for each of the signals. The signals have vertical axes representing respective signal magnitudes, which may be different for each signal.

The signal labeled "WL" 656 represents a magnitude of the signal on the access line during a sensing (read) operation. The signals labeled "TC" include a default read level 651 and a calibrated read level 653, either of which could be applied during the sensing (read) operation. The signal labeled "boost" 655 represents a boost signal (e.g., voltage) that can be applied to cause the sensing circuitry to sense a selected memory cell as though the default read signal 650 (in FIG. 6A) was changed to the calibrated read signal 652 (in FIG. 6A). The boost signal 655 can be applied to sensing circuitry (e.g., a page buffer). The signals and labels illustrated in FIG. 6B correspond to the circuitry illustrated in FIG. 7.

In some embodiments, the boost signal does not cause a change to the magnitude of the signal applied to an access line being read. See, for example, that the signal 656 on the access line, once high, does not change in magnitude when the boost signal 655 changes. Instead, application of the boost signal 655 causes a change in the operation of the sensing circuitry having an analogous effect to what would happen if the magnitude of the signal applied to the access line was changed. In other words, application of the boost signal 655 can cause the sensing circuitry to read a memory cell as though a signal of different magnitude was being applied to the access line, although the magnitude of such a signal has not changed. This is illustrated by the change from the default read level 651 to the calibrated read level 653 represented by the dotted line. This change occurs coincidently with the application of the boost signal 655 (when the magnitude of the boost signal changes).

Figure 7:
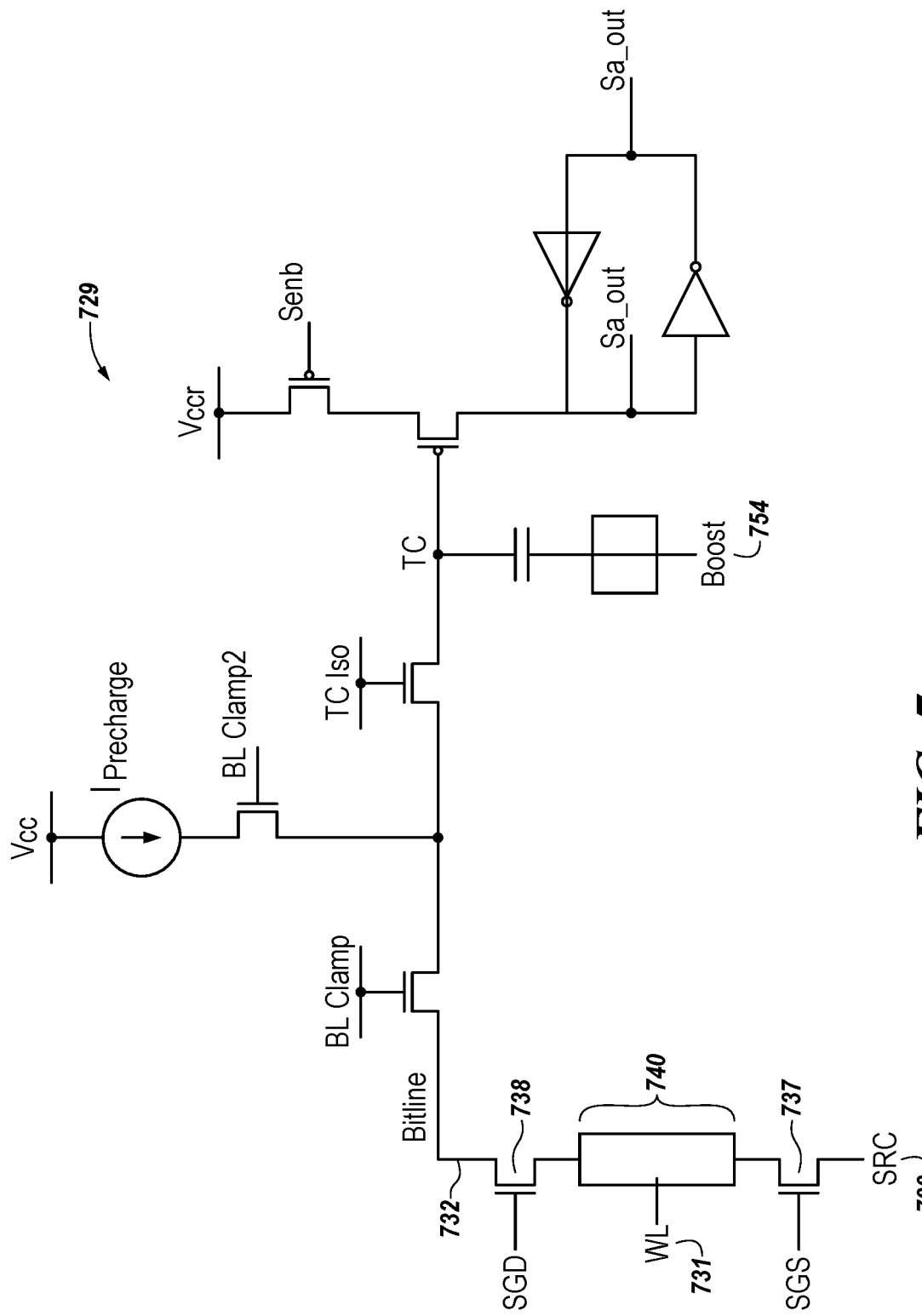
FIG. 7 is a schematic of circuitry inside a page buffer for read level calibration by sector in accordance with a number of embodiments of the present disclosure.

FIG. 7 is a schematic of circuitry inside a page buffer for read level calibration by sector in accordance with a number of embodiments of the present disclosure. The labels on the circuitry in FIG. 7 (e.g., "WL", "TC", and "Boost") correspond to the labels in FIG. 6B. The circuitry can be coupled to or part of a page buffer. The circuitry can be coupled to or part of sensing circuitry 729. The sensing circuitry can be coupled to a large number of sense lines (see FIG. 4, for example) of which one sense line 732 ("Bitline") is illustrated. The sense line 732 is coupled to a string 740 of memory cells via a select gate drain ("SGD") transistor 738. Each memory cell of the string 740 is associated with a different access line 731 ("WL"). The string 740 of memory cells is coupled to a source ("SRC") 733 via a select gage source transistor ("SGS") 737.

The sense line is selectively coupled to the page buffer by a clamp ("BL Clamp"). The sense line can be precharged by a voltage source ("Vcc") and current precharge circuitry ("$I_{Precharge}$") via a second clamp ("BL Clamp2"). The precharge circuitry and sense line 732 can be isolated from the node labeled "TC" by boost isolation circuitry ("TC Iso"). The boost signal 754 can be applied at the node labeled "TC" via a capacitor before the signal from the sense line 732 reaches the sensing circuitry 729, which includes the nodes labeled "Vccr", "Senb", and "Sa_out".

Application of the boost signal 754 alters the magnitude of the signal coming from the sense line 732. The magnitude of the boost signal 754 can be set such that it alters the magnitude of the signal coming from the sense line 732 to effectuate what the signal on the sense line 732 would be had the magnitude of the read signal applied to the selected access line 731 been calibrated to read a particular data state for a particular sector of an access line. In other words, the boost signal 754 can be calibrated per sector to provide a calibrated read level as described herein. Such embodiments can simplify the circuitry used to read memory cells versus an approach that would apply different discrete read signals to an access line to read a memory cell (e.g., circuitry capable of applying at least seven discrete read signals to an access line to sense and 8-bit memory cell) and on top of that boost such signals by varying amounts as part of a read calibrate operation. The application of different discrete read signals to an access line can require more complicated circuitry than the application of varying boost signals 754 to a page buffer.

Figure 8:
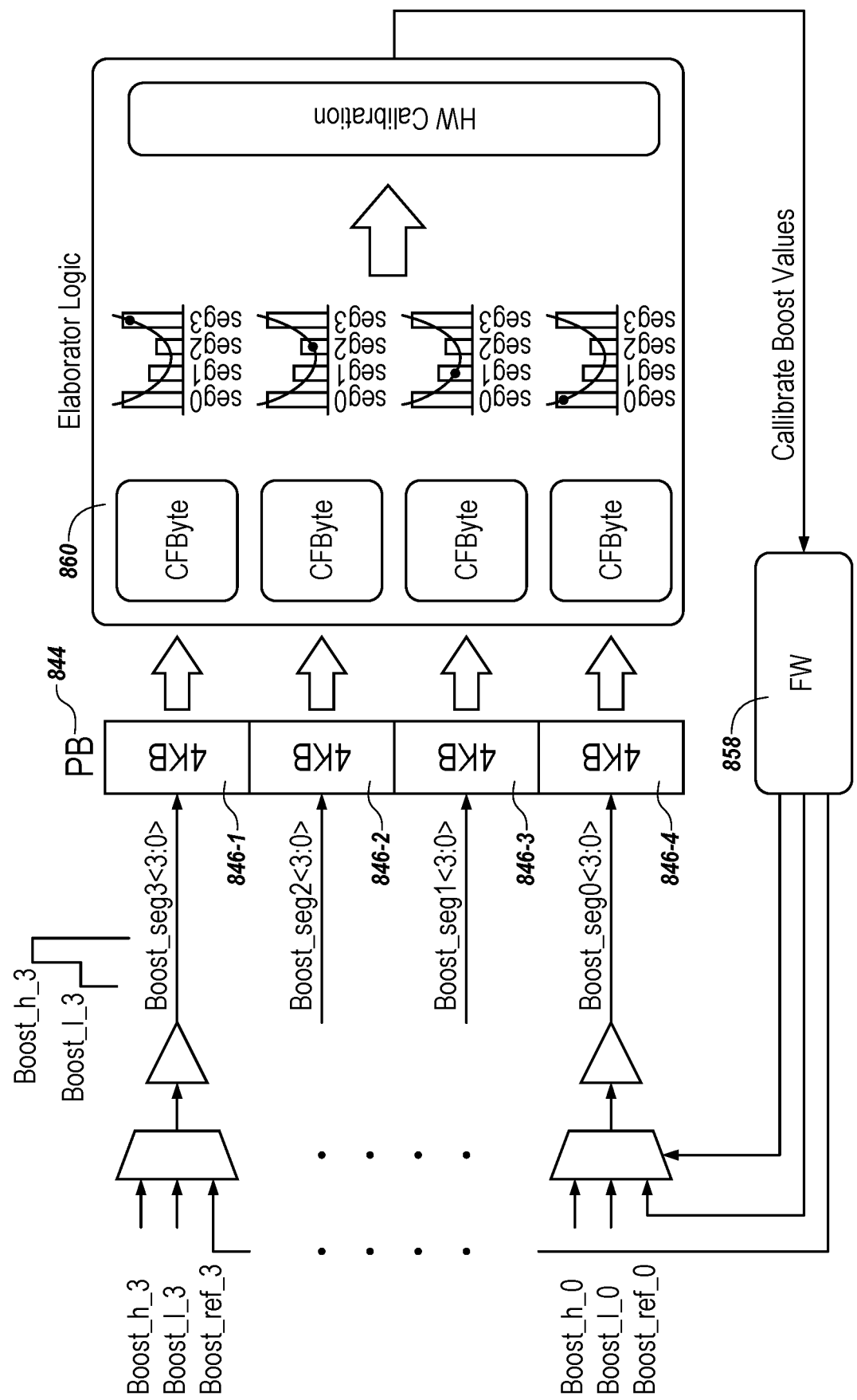
FIG. 8 is a block diagram of circuitry for read level calibration by sector in accordance with a number of embodiments of the present disclosure.

FIG. 8 is a block diagram of circuitry for read level calibration by sector in accordance with a number of embodiments of the present disclosure. The circuitry includes elaborator logic 860 receiving input from the page buffer 844 and providing output to firmware 858. The elaborator logic 860 can be implemented in hardware such as a field programmable gate array, an ASIC, etc. The firmware 858 represents executable instructions, which may also be referred to as code. The firmware 858 provides output to control the boost signal applied to various sectors 846-1, 846-2, 846-3, 846-4 of the page buffer 844. The page buffer 844 includes the circuitry necessary to apply the boost signals (e.g., the circuitry illustrated on the left side of FIG. 8). The elaborator logic 860 and/or firmware 858 can be part of the read calibration circuitry 222 as illustrated in FIG. 2, or part of the sensing circuitry 229 as illustrated in FIG. 2.

The elaborator logic 860 includes counters ("CFByte") for each sector 846 configured to count passing and failing bits for each sector for each different read level associated with a read calibration operation. The read calibration operation can include a default read level, for example, where no boost signal is applied to the page buffer 844 such that the output of the memory cells to which a sensing signal is applied is not affected. The read calibration operation can include the use of one or more different read levels caused by the application of boost signals of different magnitudes being applied to the page buffer 844. For the default read level and each different read level, the elaborator logic 860 can count the number of errors per sector 846. This is represented by the histograms illustrated in the elaborator logic 860. The elaborator logic 860 can perform hardware calibration to select a respective read level for each sector 846 that provides a fewest number of errors for that sector 846. As a result, each sector 846 can be read with a calibrated read level that is specific to that sector 846. In some instances, more than one sector 846 can have a same read level. Although not specifically illustrated in FIG. 8, the read calibration operation can be performed for more than one data state to which the memory cells can be programmed. The elaborator logic 860 can provide a signal indicative of the calibrated read level for each sector 846 to the firmware 858. The firmware 858 can cause a respective appropriate boost signal to be applied to each sector 846 of the page buffer 844 so that the desired calibrated read level is used for each sector 846 as a result of the read calibration operation.

The firmware 858 can be associated with firmware storage (not specifically illustrated) and can be coupled to control circuitry (e.g., control circuitry 220 illustrated in FIG. 2). The control circuitry can cause, per sector 846, calibrated read signals to be stored in the firmware storage. The control circuitry can cause, per sector 846, a respective calibrated read level to be stored for data states to which the memory cells of a memory array are programmable. The calibrated read signals can be stored as data indicative of the calibrated read signal and/or data indicative of the corresponding boost signal therefor. In FIG. 8, different boost signal are represented by "Boost_ref", "Boost_1", and "Boost_h", which can be referred to as a default or reference boost signal, a low boost signal, and a high boost signal. Embodiments are not limited to a particular quantity of boost signals.

Figure 9:
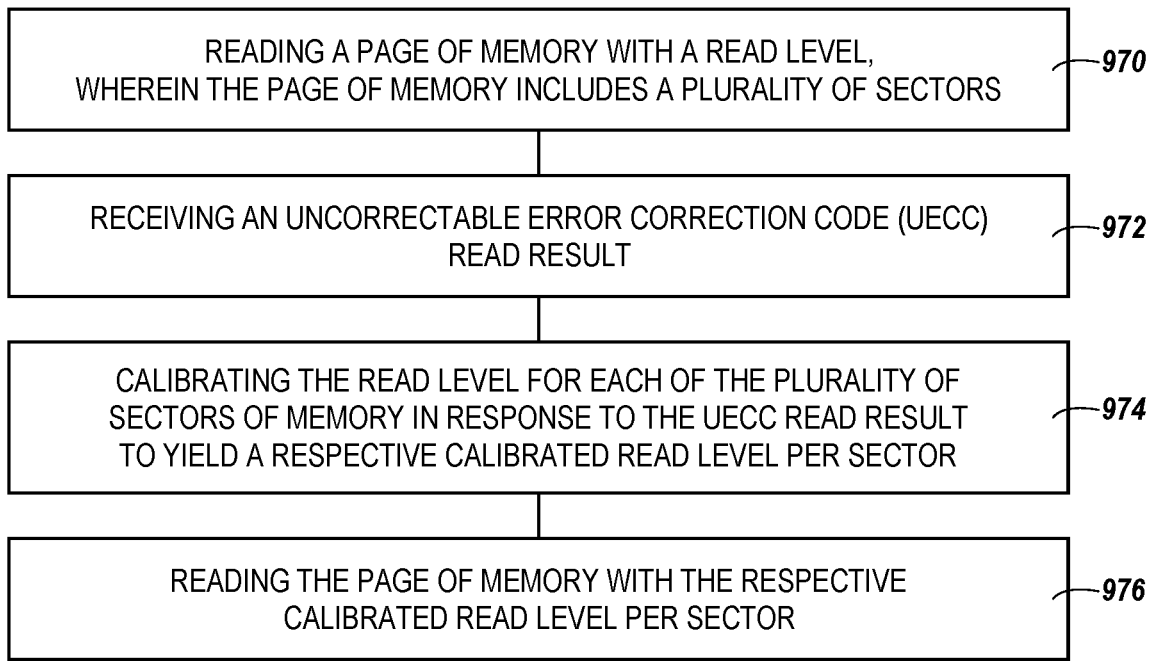
FIG. 9 is a flow diagram of a method for read calibration by sector of memory in accordance with a number of embodiments of the present disclosure.

FIG. 9 is a flow diagram of a method for read calibration by sector of memory in accordance with a number of embodiments of the present disclosure. The method can be performed by processing logic that can include hardware (e.g., a processing device, circuitry, dedicated logic, programmable logic, microcode, hardware of a device, integrated circuit, etc.), software (e.g., instructions run or executed on a processing device), or a combination thereof. In some embodiments, the method is performed by the control circuitry (e.g., control circuitry 220 illustrated in FIG. 2). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 970, the method can include reading a page of memory with a read level. The read level can be a default read level or a previously calibrated read level. The page of memory includes more than one sector. At block 972, the method can include receiving an uncorrectable error correction code (UECC) read result. In some embodiments, the UECC read result can be received from ECC circuitry, such as ECC circuitry 112 illustrated in FIG. 1.

At block 974, the method can include calibrating the read level for each of the sectors of memory in response to the UECC read result. Calibrating the read level for each sector yields a respective calibrated read level per sector. Calibrating the read level can include applying a fixed signal to an access line associated with the page of memory, applying different boost signals to a page buffer associated with the page of memory, counting a respective quantity of passing bits for each of the boost signals, and adjusting the read level based on the respective quantity of passing bits for each of the different boost signals.

Applying the boost signals can include applying a first boost signal having a lesser magnitude than a reference boost signal associated with a default or previously calibrated read level. Applying the boost signals can also include applying a second boost signal having a greater magnitude than the default boost signal. Other boost signals of greater or lesser magnitude can be applied to further precision the read level.

Adjusting the read level based on the respective quantity of passing bits can include adjusting the read level according to one of the different boost signals that yields a greatest quantity of passing bits. In some embodiments, instead of counting passing bits, a respective quantity of errors can be counted. In such embodiments, the read level can be adjusted according to one of the different boost signal that minimizes the errors for a given sector.

At block 976, the method can include reading the page of memory with the respective calibrated read level per sector. In some embodiments, the respective calibrated read level per sector can be stored in firmware. A RAIN operation can be performed to recover data in response to a subsequent UECC read result being received after reading the page of memory with the calibrated read level per sector. For example, the RAIN operation can be performed by RAIN circuitry 114 illustrated in FIG. 1.

Figure 10:
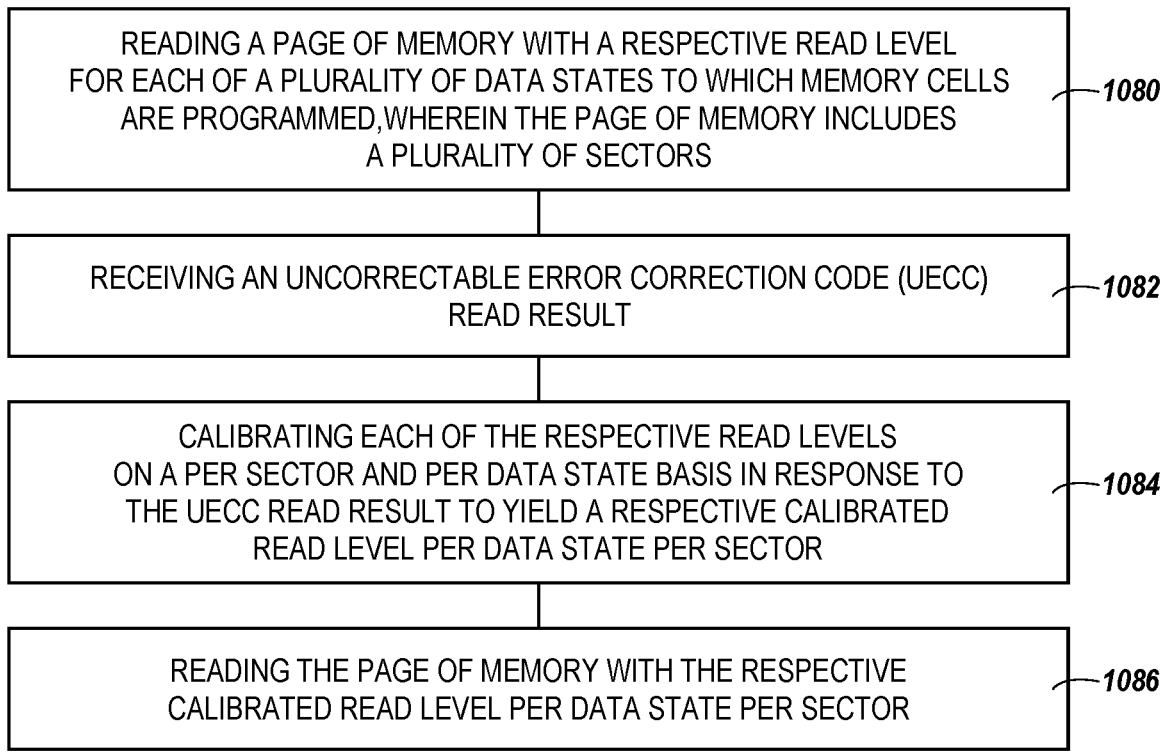
FIG. 10 is a flow diagram of a method for read calibration by sector of memory in accordance with a number of embodiments of the present disclosure.

FIG. 10 is a flow diagram of a method for read calibration by sector of memory in accordance with a number of embodiments of the present disclosure. At block 1080, the method can include reading a page of memory with a respective read level for each data state to which memory cells are programmed. The page of memory cells includes more than one sector. At block 1082, the method can include receiving a UECC read results.

At block 1084, the method can include calibrating each of the respective read levels on a per sector and per data state basis in response to the UECC read result. Calibrating each of the respective read levels yields a respective calibrated read level per data state per sector. Calibrating can include applying a fixed signal to an access line associated with the page of memory and, for each of the data states, applying a respective set of boost signals to a page buffer associated with the page of memory, counting a respective quantity of passing bits for each of the plurality of boost signals, and adjusting the respective read levels based on the respective quantity of passing bits for each of the boost signals. As described above, in some embodiments, errors can be counted instead of passing bits. In some instances, at least one of the respective read levels may not be adjusted based on the count of passing bits or errors. For example, some of the read levels may need to be adjusted and some may not. In some embodiments, each of the respective read levels can be calibrated simultaneously on a per sector and per data state basis. In some embodiments, each of the respective read levels can be calibrated sequentially on a per sector and per data state basis.

At block 1086, the method can include reading the page of memory with the respective calibrated read levels. Although not specifically illustrated, the method can include inhibiting RAIN operations until the respective read levels are calibrated. Inhibiting RAIN until after calibration can be beneficial in order to reduce unnecessary use of time and power to perform a RAIN operation that might not be necessary of the read level calibration operation is sufficient to address the UECC read result. After calibration, if the UECC read result persists, a RAIN operation can be performed.

The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
reading a page of memory with a read level, wherein the page of memory includes a plurality of sectors;
receiving an uncorrectable error correction code (UECC) read result;
calibrating the read level for each of the plurality of sectors of memory in response to the UECC read result to yield a respective calibrated read level per sector;
reading the page of memory with the respective calibrated read level per sector;
receiving a subsequent UECC read result after reading the page of memory with the respective calibrated read level per sector; and
performing a redundant array of independent NAND (RAIN) operation to recover data in response to the subsequent UECC read result.

2. The method of claim 1, wherein calibrating the read level comprises:
applying a fixed signal to an access line associated with the page of memory;
applying a plurality of boost signals to a page buffer associated with the page of memory;
counting a respective quantity of passing bits for each of the plurality of boost signals; and
adjusting the read level based on the respective quantity of passing bits for each of the plurality of boost signals.

3. The method of claim 2, wherein adjusting comprises adjusting the read level according to one of the plurality of boost signals yielding a greatest quantity of passing bits.

4. The method of claim 2, wherein applying the plurality of boost signals includes:
applying a first boost signal having a lesser magnitude than a reference boost signal associated with the read level; and
applying a second boost signal having a greater magnitude than the reference boost signal.

5. The method of claim 1, further comprising storing the respective calibrated read level per sector in firmware.

6. A method, comprising:
reading a page of memory with a respective read level for each of a plurality of data states to which memory cells are programmed, wherein the page of memory includes a plurality of sectors;
receiving an uncorrectable error correction code (UECC) read result;
calibrating each of the respective read levels on a per sector and per data state basis in response to the UECC read result to yield a respective calibrated read level per data state per sector;
inhibiting a redundant array of independent NAND (RAIN) operation until the respective read levels are calibrated; and
reading the page of memory with the respective calibrated read level per data state per sector.

7. The method of claim 6, wherein calibrating each of the respective read levels comprises applying a fixed signal to an access line associated with the page of memory; and
for each of the plurality of data states:
applying a respective plurality of boost signals to a page buffer associated with the page of memory;
counting a respective quantity of passing bits for each of the plurality of boost signals; and
adjusting the respective read level based on the respective quantity of passing bits for each of the respective plurality of boost signals.

8. The method of claim 7, further comprising, for at least one of the respective read levels, not adjusting the respective read level based on the respective quantity of passing bits for each of the respective plurality of boost signals.

9. The method of claim 6, wherein calibrating comprises calibrating each of the respective read levels simultaneously on a per sector and per data state basis.

10. The method of claim 6, wherein calibrating comprises calibrating each of the respective read levels sequentially on a per sector and per data state basis.

11. An apparatus, comprising:
an array of memory cells coupled to access lines and sense lines;
sensing circuitry coupled to the sense lines; and
control circuitry coupled to the array and to the sensing circuitry, wherein the control circuitry is configured to cause:
 a respective plurality of different read signals to be applied to each of a plurality of sectors of a selected access line;
 a quantity of passing bits associated with application of each of the respective plurality of different read signals to be counted per sector; and
 a respective one of the different read signals that yields a greatest quantity of passing bits per sector to be set as a calibrated read signal to be used to read the sector for subsequent read operations.

12. The apparatus of claim 11, wherein the control circuitry is configured to cause a respective plurality of different boost signals to be applied to the sense lines per sector to effectuate application of the respective plurality of different read signals.

13. The apparatus of claim 11, wherein the control circuitry is configured to cause the read signals to be calibrated in response to an uncorrectable error correction code (UECC) result for a read operation being reported.

14. The apparatus of claim 13, wherein the control circuitry is configured to cause a data recovery operation to be performed in response to the UECC result.

15. A method, comprising:
reading a page of memory with a read level, wherein the page of memory includes a plurality of sectors;
receiving an uncorrectable error correction code (UECC) read result;
calibrating the read level for each of the plurality of sectors of memory in response to the UECC read result to yield a respective calibrated read level per sector, wherein calibrating the read level comprises:
 applying a fixed signal to an access line associated with the page of memory;
 applying a plurality of boost signals to a page buffer associated with the page of memory;
 counting a respective quantity of passing bits for each of the plurality of boost signals; and
 adjusting the read level based on the respective quantity of passing bits for each of the plurality of boost signals; and
reading the physical page of memory with the respective calibrated read level per physical sector.

16. The method of claim 15, wherein adjusting comprises adjusting the read level according to one of the plurality of boost signals yielding a greatest quantity of passing bits.

17. The method of claim 15, wherein applying the plurality of boost signals includes:
applying a first boost signal having a lesser magnitude than a reference boost signal associated with the read level; and
applying a second boost signal having a greater magnitude than the reference boost signal.

18. A method, comprising:
reading a page of memory with a respective read level for each of a plurality of data states to which memory cells are programmed, wherein the page of memory includes a plurality of sectors;
receiving an uncorrectable error correction code (UECC) read result;
calibrating each of the respective read levels on a per physical sector and per data state basis in response to the UECC read result to yield a respective calibrated read level per data state per physical sector, wherein calibrating each of the respective read levels comprises applying a fixed signal to an access line associated with the page of memory; and
for each of the plurality of data states:
 applying a respective plurality of boost signals to a page buffer associated with the page of memory;
 counting a respective quantity of passing bits for each of the plurality of boost signals; and
 adjusting the respective read level based on the respective quantity of passing bits for each of the respective plurality of boost signals; and
reading the physical page of memory with the respective calibrated read level per data state per physical sector.

19. The method of claim 18, further comprising, for at least one of the respective read levels, not adjusting the respective read level based on the respective quantity of passing bits for each of the respective plurality of boost signals.

* * * * *